United States Patent
Hurwitz et al.

(10) Patent No.: US 9,642,261 B2
(45) Date of Patent: May 2, 2017

(54) COMPOSITE ELECTRONIC STRUCTURE WITH PARTIALLY EXPOSED AND PROTRUDING COPPER TERMINATION POSTS

(71) Applicant: Zhuhai Advanced Chip Carriers & Electronic Substrate Solutions Technologies Co. Ltd., Zhuhai (CN)

(72) Inventors: Dror Hurwitz, Zhuhai (CN); Alex Huang, Zhuhai (CN)

(73) Assignee: Zhuhai Advanced Chip Carriers & Electronic Substrate Solutions Technologies Co. Ltd., Zhuhai (CN)

( * ) Notice: Subject to any disclaimer, the term of this patent is extended or adjusted under 35 U.S.C. 154(b) by 223 days.

(21) Appl. No.: 14/163,084

(22) Filed: Jan. 24, 2014

(65) Prior Publication Data

US 2015/0214171 A1    Jul. 30, 2015

(51) Int. Cl.
*H05K 3/40* (2006.01)
*H05K 1/02* (2006.01)

(52) U.S. Cl.
CPC ...... *H05K 3/4007* (2013.01); *H01L 2224/131* (2013.01); *H01L 2924/12042* (2013.01); *H01L 2924/14* (2013.01); *H05K 1/0298* (2013.01); *H05K 2201/0367* (2013.01); *H05K 2201/09481* (2013.01)

(58) Field of Classification Search
None
See application file for complete search history.

(56) References Cited

U.S. PATENT DOCUMENTS

| | | | | |
|---|---|---|---|---|
| 5,089,880 A * | 2/1992 | Meyer | ..................... | H01L 23/32 257/692 |
| 5,292,574 A * | 3/1994 | Kata | ...................... | H01L 23/15 257/E23.009 |
| 5,808,360 A * | 9/1998 | Akram | ................ | H01L 21/4853 228/180.22 |
| 5,855,711 A * | 1/1999 | Araki | .................... | C04B 35/111 156/277 |
| 6,532,143 B2 * | 3/2003 | Figueroa | .................. | H01G 4/30 257/296 |
| 6,643,923 B1 * | 11/2003 | Hishinuma | ......... | H01L 21/4853 174/267 |
| 7,670,950 B2 * | 3/2010 | Richardson | .............. | C25D 3/38 257/E21.174 |

(Continued)

FOREIGN PATENT DOCUMENTS

KR    1020130023263 A    3/2013

*Primary Examiner* — Jeremy C Norris
*Assistant Examiner* — Muhammed Azam
(74) *Attorney, Agent, or Firm* — Wiggin and Dana LLP; Gregory S. Rosenblatt; Jonathan D. Hall

(57) ABSTRACT

A multilayer composite electronic structure comprising feature layers extending in an X-Y plane, each adjacent pair of feature layers being separated by an inner via layer, the via layer comprising via posts that couple adjacent feature layers in a Z direction perpendicular to the X-Y plane, the via posts being embedded in an inner layer dielectric, the multilayer composite structure further comprising at least one outer layer of terminations comprising at least one copper post that is only partially embedded in an outer layer of dielectric such that part of the at least one copper post protrudes beyond surface of the outer layer of dielectric.

17 Claims, 14 Drawing Sheets

(56) References Cited

U.S. PATENT DOCUMENTS

| | | | | |
|---|---|---|---|---|
| 7,875,810 B2* | 1/2011 | Nozu | ................... | B32B 18/00 |
| | | | | 174/262 |
| 8,755,887 B2* | 6/2014 | Troetzschel | ......... | A61N 1/3754 |
| | | | | 607/36 |
| 9,137,903 B2* | 9/2015 | Kang | ................... | H05K 1/113 |
| 9,440,135 B2* | 9/2016 | Hurwitz | ............ | H01L 23/49822 |
| 2001/0008226 A1* | 7/2001 | Hung | ................ | H01L 21/02063 |
| | | | | 216/18 |
| 2002/0109954 A1* | 8/2002 | Tsuruta | ................ | B23Q 3/154 |
| | | | | 361/234 |
| 2002/0134582 A1* | 9/2002 | Celaya | ............ | H01L 23/49811 |
| | | | | 174/261 |
| 2002/0140105 A1* | 10/2002 | Higgins, III | ............ | H05K 3/24 |
| | | | | 257/774 |
| 2002/0149102 A1* | 10/2002 | Hashemi | ............ | H01L 23/3677 |
| | | | | 257/706 |
| 2002/0162687 A1* | 11/2002 | Akihiko | ................ | H05K 3/389 |
| | | | | 174/262 |
| 2003/0038162 A1* | 2/2003 | Chew | ................ | H01L 23/4951 |
| | | | | 228/180.21 |
| 2005/0205295 A1* | 9/2005 | Tsuk | ................ | H05K 1/0233 |
| | | | | 174/256 |
| 2007/0111387 A1* | 5/2007 | Oi | ................ | H01L 21/4814 |
| | | | | 438/108 |
| 2007/0141758 A1* | 6/2007 | Tanaka | ................ | H01L 21/4846 |
| | | | | 438/125 |
| 2008/0038506 A1* | 2/2008 | Schumacher | ......... | D03D 15/02 |
| | | | | 428/72 |
| 2008/0042261 A1* | 2/2008 | Wolter | ................ | H01L 25/0657 |
| | | | | 257/706 |
| 2008/0138576 A1* | 6/2008 | Nozu | ................ | B32B 18/00 |
| | | | | 428/138 |
| 2008/0258300 A1* | 10/2008 | Kobayashi | ......... | H01L 21/4853 |
| | | | | 257/737 |
| 2010/0147574 A1* | 6/2010 | Kaneko | ................ | H01L 21/4853 |
| | | | | 174/261 |
| 2011/0174524 A1* | 7/2011 | Sharma | ................ | C23C 18/2033 |
| | | | | 174/254 |
| 2013/0001794 A1* | 1/2013 | Roy | ................ | H05K 3/4682 |
| | | | | 257/774 |
| 2013/0056251 A1* | 3/2013 | Miyairi | ................ | H05K 1/00 |
| | | | | 174/258 |
| 2013/0200531 A1* | 8/2013 | Myung | ................ | H05K 1/0298 |
| | | | | 257/778 |
| 2013/0319737 A1 | 12/2013 | Hurwitz | | |
| 2014/0085846 A1* | 3/2014 | Ma | ................ | H01L 23/15 |
| | | | | 361/762 |
| 2014/0102765 A1* | 4/2014 | Hurwitz | ................ | H05K 3/4647 |
| | | | | 174/251 |
| 2014/0167234 A1* | 6/2014 | Hurwitz | ................ | H01L 21/563 |
| | | | | 257/668 |
| 2014/0175671 A1* | 6/2014 | Haba | ................ | H01L 23/528 |
| | | | | 257/777 |
| 2015/0195912 A1* | 7/2015 | Hurwitz | ................ | H01L 24/17 |
| | | | | 174/262 |
| 2016/0192508 A1* | 6/2016 | Arora | ................ | C23C 14/228 |
| | | | | 156/247 |

* cited by examiner

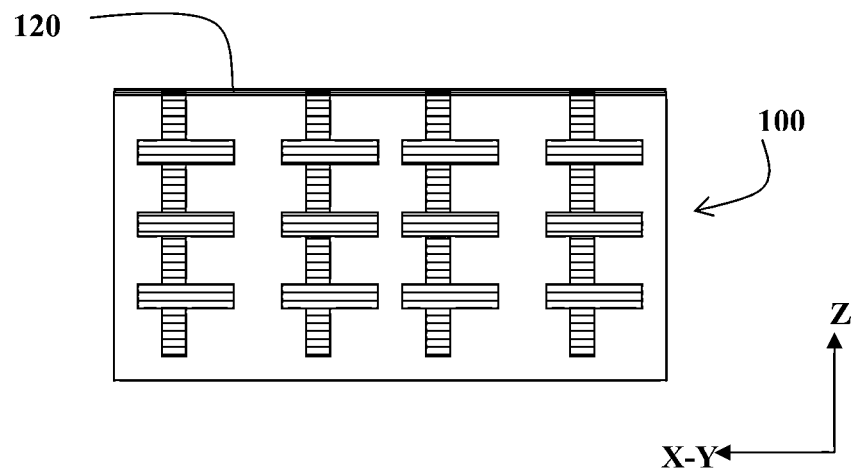
Fig. 1(iii)

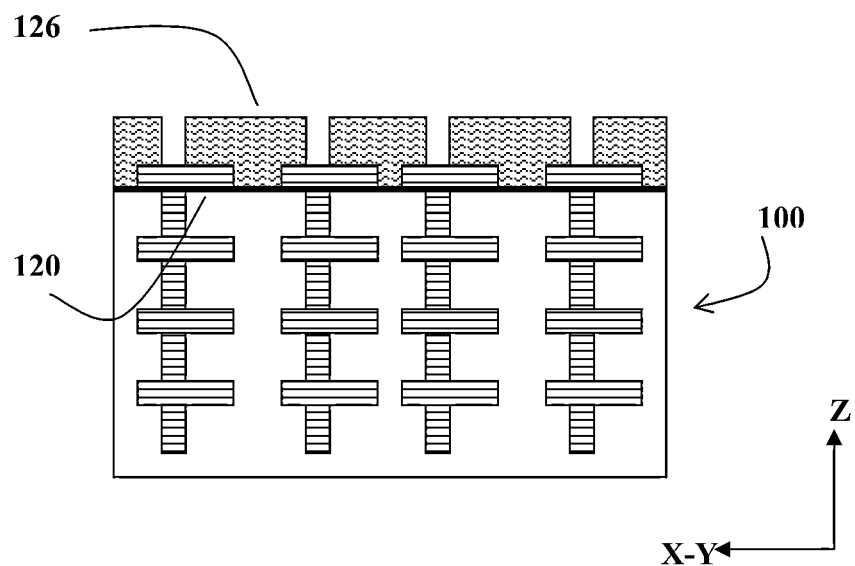
Fig. 1(vii)
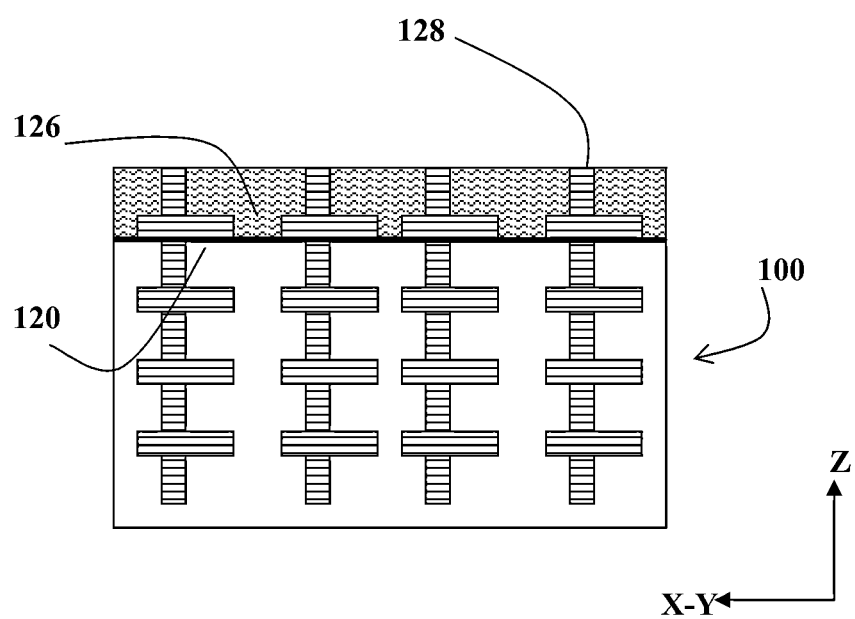
Fig. 1(viii)

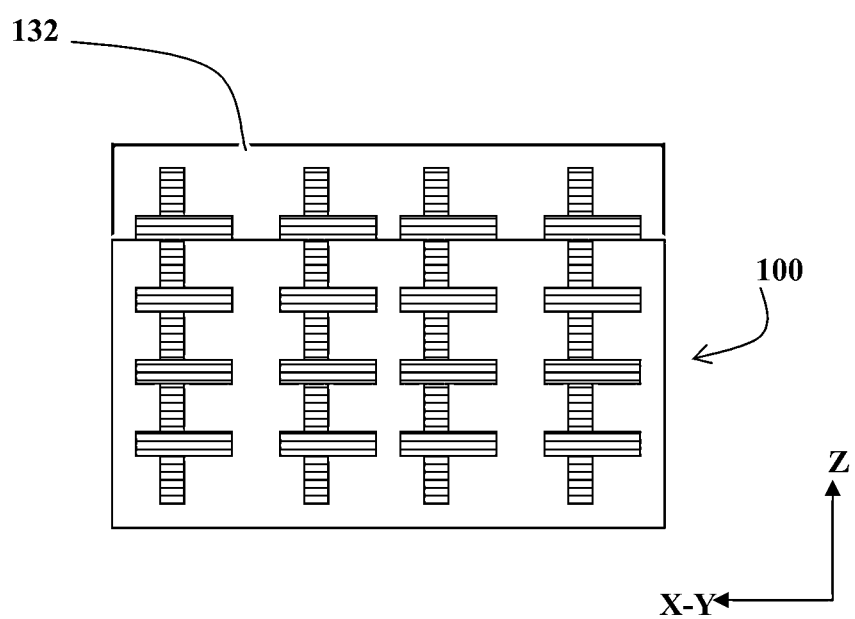
Fig. 1(xii)

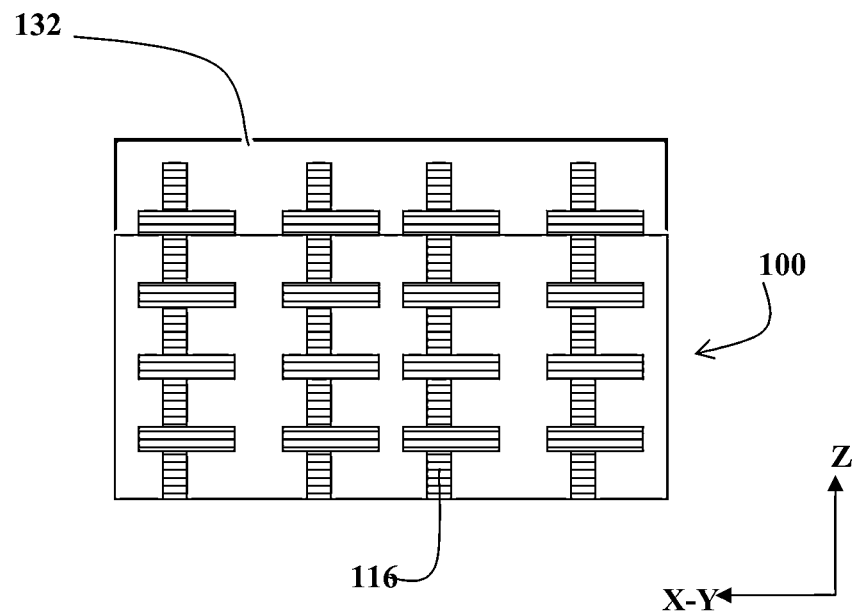
Fig. 1(xiii)a
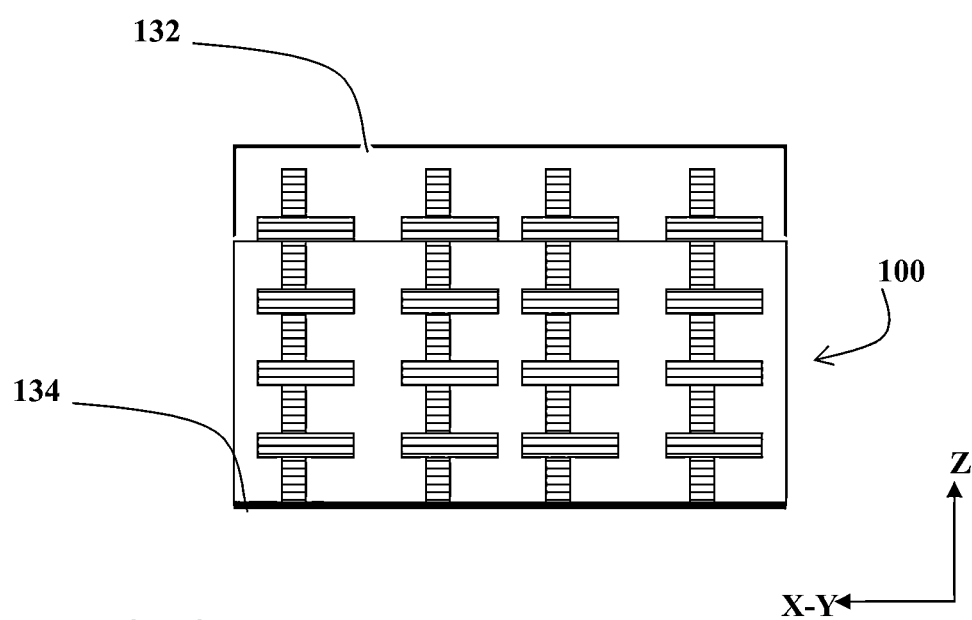
Fig. 1(xiii)b

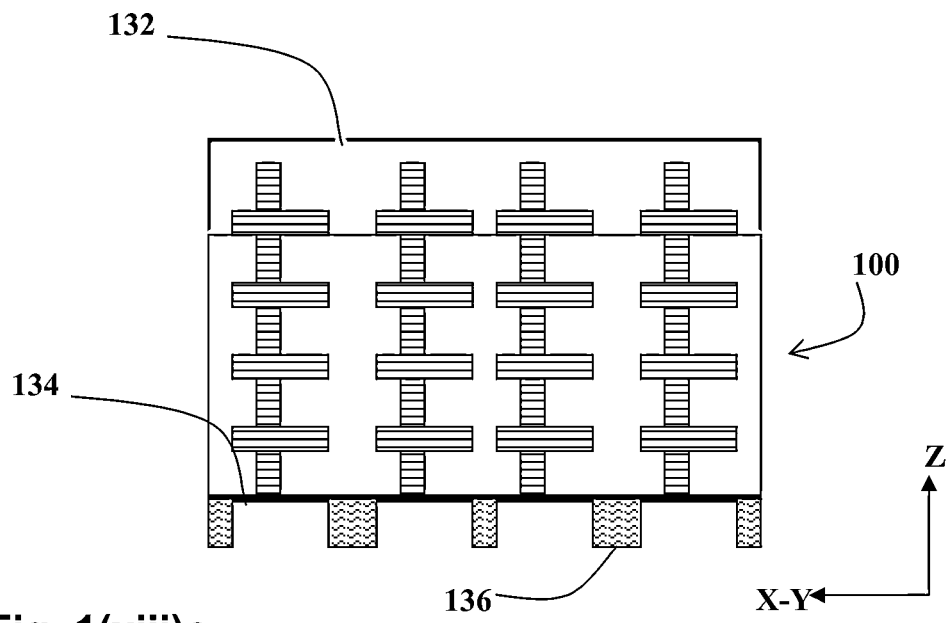
Fig. 1(xiii)c
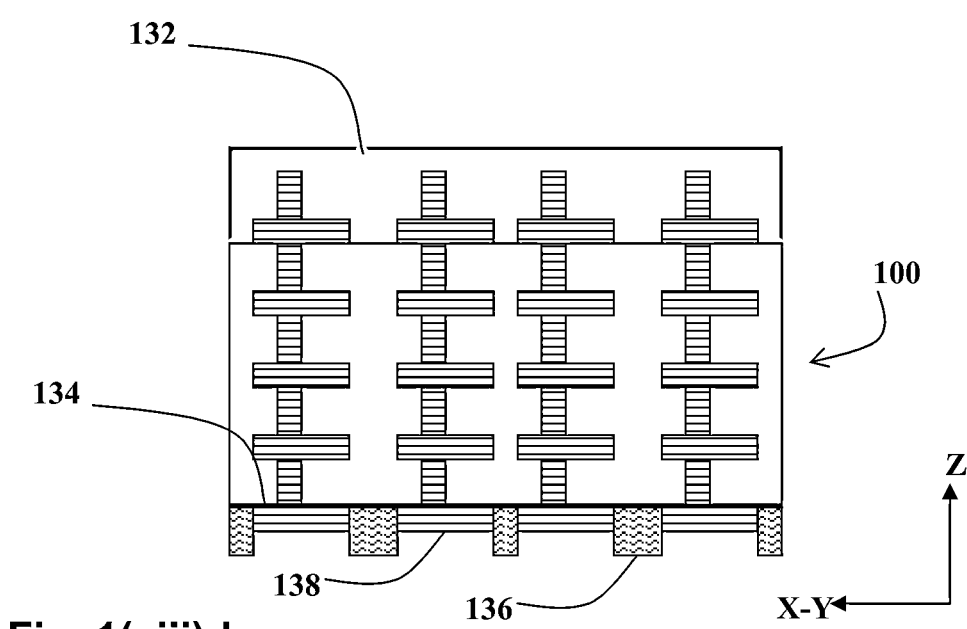
Fig. 1(xiii)d

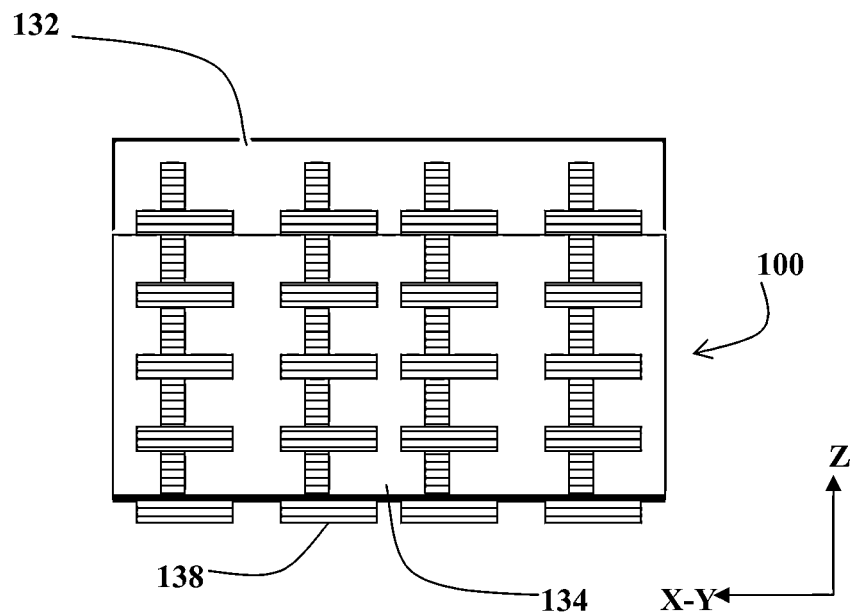
Fig. 1(xiii)e
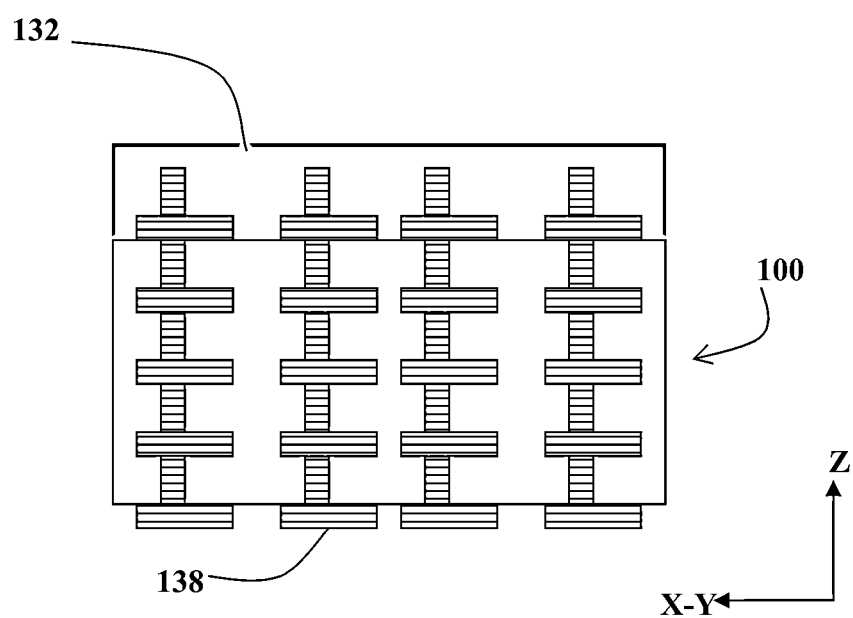
Fig. 1(xiii)f

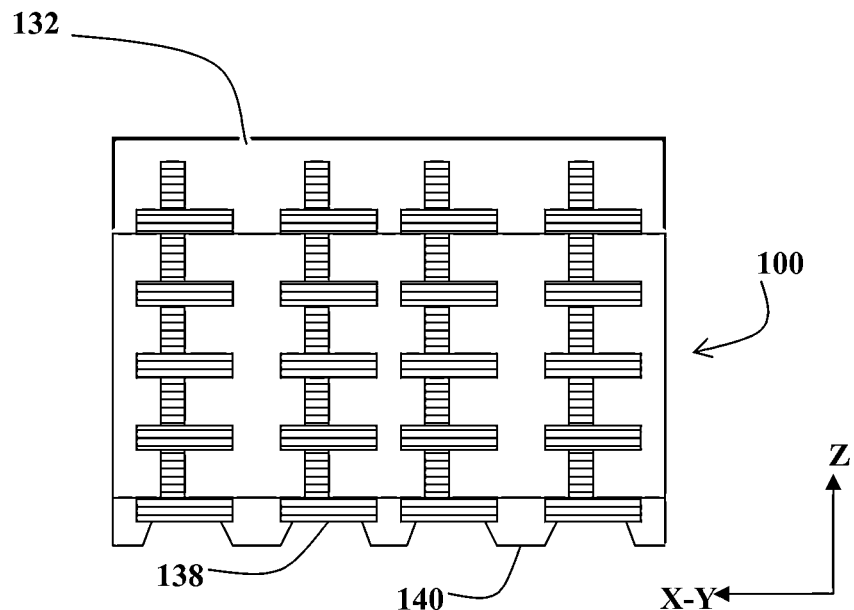
Fig. 1(xiii)g
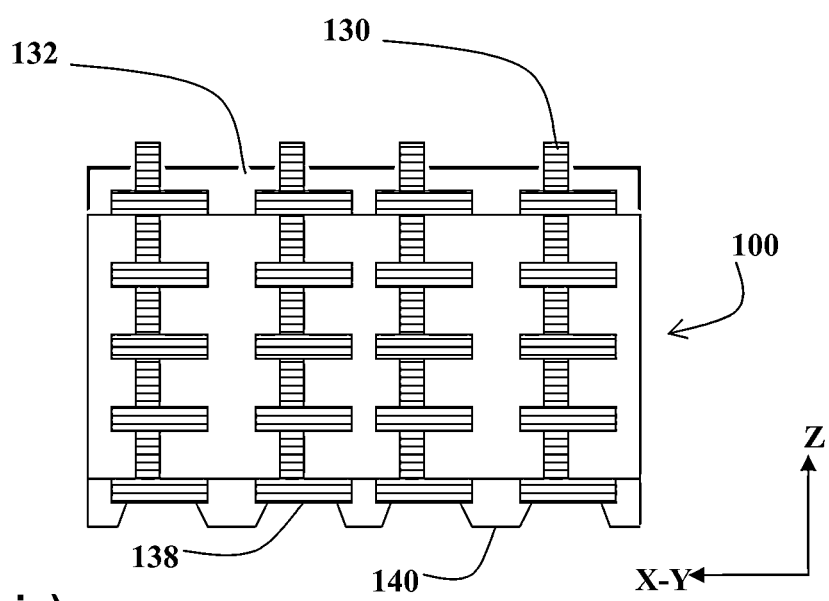
Fig. 1(xiv)

ns to smaller

COMPOSITE ELECTRONIC STRUCTURE WITH PARTIALLY EXPOSED AND PROTRUDING COPPER TERMINATION POSTS

CROSS-REFERENCE TO THE RELATED PATENT APPLICATIONS

This application relates to U.S. patent application Ser. No. 13/912,652 (that is now U.S. Pat. No. 9,049,791), entitled "Novel Terminations and Couplings Between Chips and Substrates," filed on Jun. 7, 2013 and to U.S. patent application Ser. No. 14/150,683, entitled "Substrates With Ultra Fine Pitch Flip Chip Bumps" filed on Jan. 8, 2014. The entire contents of U.S. patent application Ser. No. 13/912,652 and U.S. patent application Ser. No. 14/150,683 are incorporated herein by reference.

BACKGROUND

Field of the Disclosure

The present invention is directed to terminating interconnect structures and to coupling between chips and substrates.

Description of the Related Art

Driven by an ever greater demand for miniaturization of ever more complex electronic components, consumer electronics such as computing and telecommunication devices are becoming ever more integrated. This has created a need for support structures such as IC substrates and IC interposers that have a high density of multiple conductive layers and vias that are electrically insulated from each other by a dielectric material.

The general requirement for such support structures is reliability and appropriate electrical performance, thinness, stiffness, planarity, good heat dissipation and a competitive unit price.

Of the various approaches for achieving these requirements, one widely implemented manufacturing technique that creates interconnecting vias between layers uses lasers to drill holes through the subsequently laid down dielectric substrate through to the latest metal layer for subsequent filling with a metal, usually copper, that is deposited therein by a plating technique. This approach to creating vias is sometimes referred to as 'drill & fill', and the vias created thereby may be referred to as 'drilled & filled vias'.

There are a number of disadvantages with the drilled & filled via approach. Since each via is required to be separately drilled, the throughput rate is limited, and the costs of fabricating sophisticated, multi-via IC substrates and interposers becomes prohibitive. In large arrays it is difficult to produce a high density of high quality vias having different sizes and shapes in close proximity to each other by the drill & fill methodology. Furthermore, laser drilled vias have rough side walls and taper inwards through the thickness of the dielectric material. This tapering reduces the effective diameter of the via. It may also adversely affect the electrical contact to the previous conductive metal layer especially at ultra small via diameters, thereby causing reliability issues. Additionally, the side walls are particularly rough where the dielectric being drilled is a composite material comprising glass or ceramic fibers in a polymer matrix, and this roughness may result in stray inductances.

The filling process of the drilled via holes is usually achieved by copper electroplating. Electroplating into a drilled hole may result in dimpling, where a small crater appears at the end of the via. Alternatively, overfill may result, where a via channel is filled with more copper than it can hold, and a domed upper surface that protrudes over the surrounding material is created. Both dimpling and overfill tend to create difficulties when subsequently stacking vias one on end of the other, as required when fabricating high-density substrates and interposers. Furthermore, it will be appreciated that large via channels are difficult to fill uniformly, especially when they are in proximity to smaller vias within the same interconnecting layer of the interposer or IC substrate design.

The range of acceptable sizes and reliability is improving over time. Nevertheless, the disadvantages described hereinabove are intrinsic to the drill & fill technology and are expected to limit the range of possible via sizes. It will further be noted that laser drilling is best for creating round via channels. Although slot shaped via channels may theoretically be fabricated by laser milling, in practice, the range of geometries that may be fabricated is somewhat limited and vias in a given support structure are typically cylindrical and substantially identical.

Fabrication of vias by drill & fill is expensive and it is difficult to evenly and consistently fill the via channels created thereby with copper using the relatively, cost-effective electroplating process.

Laser drilled vias in composite dielectric materials are practically limited to a minimum diameter of $60 \times 10^{-6}$ m, and even so suffer from significant tapering shape as well as rough side walls due to the nature of the composite material drilled, in consequence of the ablation process involved.

In addition to the other limitations of laser drilling as described hereinabove, there is a further limitation of the drill & fill technology in that it is difficult to create different diameter vias in the same layer, since when drill different sized via channels are drilled and then filled with metal to fabricate different sized vias, the via channels fill up at different rates. Consequently, the typical problems of dimpling or overfill that characterize drill & fill technology are exasperated, since it is impossible to simultaneously optimize deposition techniques for different sized vias.

An alternative solution that overcomes many of the disadvantages of the drill & fill approach, is to fabricate vias by depositing copper or other metal into a pattern created in a photo-resist, using a technology otherwise known as 'pattern plating'.

In pattern plating, a seed layer is first deposited. Then a layer of photo-resist is deposited thereover and subsequently exposed to create a pattern, and selectively removed to make trenches that expose the seed layer. Via posts are created by depositing Copper into the photo-resist trenches. The remaining photo-resist is then removed, the seed layer is etched away, and a dielectric material that is typically a polymer impregnated glass fiber mat, is laminated thereover and therearound to encase the via posts. Various techniques and processes can then be used to planarize the dielectric material, removing part of it to expose the ends of the via posts to allow conductive connection to ground thereby, for building up the next metal layer thereupon. Subsequent layers of metal conductors and via posts may be deposited there onto by repeating the process to build up a desired multilayer structure.

In an alternative but closely linked technology, known hereinafter as 'panel plating', a continuous layer of metal or alloy is deposited onto a substrate. A layer of photo-resist is deposited over an end of the substrate, and a pattern is developed therein. The pattern of developed photo-resist is stripped away, selectively exposing the metal thereunder, which may then be etched away. The undeveloped photoresist protects the underlying metal from being etched away, and leaves a pattern of upstanding features and vias.

After stripping away the undeveloped photo-resist, a dielectric material, such as a polymer impregnated glass fiber mat, may be laminated around and over the upstanding copper features and/or via posts. After planarizing, subsequent layers of metal conductors and via posts may be deposited there onto by repeating the process to build up a desired multilayer structure.

The via layers created by pattern plating or panel plating methodologies described above are typically known as 'via posts' and feature layers from copper.

It will be appreciated that the general thrust of the microelectronic evolution is directed towards fabricating ever smaller, thinner, lighter and more powerful products having high reliability. The use of thick, cored interconnects, prevents ultra-thin products being attainable. To create ever higher densities of structures in the interconnect IC substrate or 'interposer', ever more layers of ever smaller connections are required. Indeed, sometimes it is desirable to stack components.

If plated, laminated structures are deposited on a copper or other appropriate sacrificial substrate, the substrate may be etched away leaving free standing, coreless laminar structures. Further layers may be deposited on the side previously adhered to the sacrificial substrate, thereby enabling a two sided build up, which minimizes warping and aids the attaining of planarity.

One flexible technology for fabricating high density interconnects is to build up pattern or panel plated multilayer structures consisting of metal vias or via post features having various geometrical shapes and forms in a dielectric matrix. The metal may be copper and the dielectric may be a fiber reinforced polymer. Typically a polymer with a high glass transition temperature ($T_g$) is used, such as polyimide, for example. These interconnects may be cored or coreless, and may include cavities for stacking components. They may have odd or even numbers of layers and the vias may have non circular shapes. Enabling technology is described in previous patents issued to Amitec-Advanced Multilayer Interconnect Technologies Ltd.

For example, U.S. Pat. No. 7,682,972 to Hurwitz et al. titled "Advanced multilayer coreless support structures and method for their fabrication" describes a method of fabricating a free standing membrane including a via array in a dielectric, for use as a precursor in the construction of superior electronic support structures. The method includes the steps of fabricating a membrane of conductive vias in a dielectric surround on a sacrificial carrier, and detaching the membrane from the sacrificial carrier to form a free standing laminated array. An electronic substrate based on such a free standing membrane may be formed by thinning and planarizing the laminated array, followed by terminating the vias. This publication is incorporated herein by reference in its entirety.

U.S. Pat. No. 7,669,320 to Hurwitz et al. titled "Coreless cavity substrates for chip packaging and their fabrication" describes a method for fabricating an IC support for supporting a first IC die connected in series with a second IC die; the IC support comprising a stack of alternating layers of copper features and vias in insulating surround, the first IC die being bondable onto the IC support, and the second IC die being bondable within a cavity inside the IC support, wherein the cavity is formed by etching away a copper base and selectively etching away built up copper. This publication is incorporated herein by reference in its entirety.

U.S. Pat. No. 7,635,641 to Hurwitz et al. titled "Integrated circuit support structures and their fabrication" describes a method of fabricating an electronic substrate comprising the steps of; (A) selecting a first base layer; (B) depositing a first etchant resistant barrier layer onto the first base layer; (C) building up a first half stack of alternating conductive layers and insulating layers, the conductive layers being interconnected by vias through the insulating layers; (D) applying a second base layer onto the first half stack; (E) applying a protective coating of photo-resist to the second base layer; (F) etching away the first base layer; (G) removing the protective coating of photo-resist; (H) removing the first etchant resistant barrier layer; (I) building up a second half stack of alternating conductive layers and insulating layers, the conductive layers being interconnected by vias through the insulating layers, wherein the second half stack has a substantially symmetrical lay up to the first half stack; (J) applying an insulating layer onto the second half stack of alternating conductive layers and insulating layers, (K) removing the second base layer, and (L) terminating the substrate by exposing ends of vias on outer surfaces of the stack and applying terminations thereto. This publication is incorporated herein by reference in its entirety.

The via post technology described in U.S. Pat. Nos. 7,682,972, 7,669,320 and 7,635,641 lends itself to mass production, with very large numbers of vias being simultaneously electroplated. As mentioned above, current drill & fill vias have an effective minimal diameter of about 60 microns. In contradistinction, via post technology using photo resist and electroplating, enables much higher densities of vias to be obtained. Via diameters of as little as 30 micron diameter are possible and various via geometries and shapes could be cofabricated within the same layer.

Over time, it is anticipated that both drill & fill technologies and via post deposition will enable fabrication of substrates with further miniaturization and higher densities of vias and features. Nevertheless, it would appear likely that developments in via post technology will maintain a competitive edge.

Substrates enable chips to interface with other components. Chips have to be bonded to substrates in a manner that provides reliable electronic connections to enable electronic communication between chips and substrates.

Among the high density leading technologies used to interconnect the Substrate to Chips is the well established "Flip Chip" technology, in which solder bumps, lead-free solder bumps, or copper bumps having solder or lead-free solder on their tips, are grown on the chip terminating pads and the chip is then flipped over to interconnect its bumps with the pads on the top surface of the substrate. As chip bumps and pitches become denser, advanced substrates are sometimes equipped with bumps of their own to assist with the interconnection to the chip bumps. Such bumps on the substrate pads are also known as "SoP" (Solder on Pad") bumps—and usually consist of (lead-tin) solder or lead-free solder. The SoP bumps are generally applied to the substrate terminating pads by stencil printing followed by reflow, or by electroplating processes followed by reflow. Such bumps are usually "coined" by applying heat and pressure to generate a top flat surface on the bumps, which can assist with the placement of the bumps from the die side.

A minimum bump array pitch on the substrate of 140 μm to 150 μm is currently used for solder bumps in many applications, and 50 μm to 60 μm pitch that correspond with the introduction of 14 nm node silicon are anticipated to be needed.

The most popular lead-free solder composition that is used for bumps on chips and substrates is the SAC alloy (tin-silver-copper). However a variety of other compositions are sometimes used. Increasingly, companies have adopted variations of these alloys with small amounts of other elements and with an extra degree of purity in the alloy to modify mechanical and physical properties, and to minimize alpha particle radiation counts.

Generating solder bumps on the substrate in ever tighter pitches is tricky, in that the current methods of stencil printing or solder ball drops are required to be more and more accurate and more expensive in order to overcome the risk of shorting between nearby connections at the finer pitches.

Copending application Ser. No. 13/912,652 filed on 7 Jun. 2013 discloses a multilayer composite electronic structure comprising at least one pair of feature layers extending in an X-Y plane, each adjacent pair of feature layer being separated by an inner via layer, the via layer comprising via posts that couple adjacent feature layers in a Z direction perpendicular to the X-Y plane, the via posts being embedded in an inner layer dielectric, the multilayer composite structure further comprising terminations consisting of an outer layer of via pillars embedded in an outer dielectric material, thinned to expose the ends of the outer layer of via pillars.

U.S. Ser. No. 13/912,652 teaches copper via posts that are embedded in dielectric and then thinned so that the ends of the copper via posts are flush with the surface of the dielectric. Typically, the thinned outer layer of via pillars with exposed ends embedded in an outer dielectric material that is substantially planar with a roughness of less than 3 microns and the exposed outer layer of via pillars is interconnectable with flip chip bumps. The ends of the via pillars which are flush with the dielectric in which they are embedded, may be connected to the flip chip bumps by a solderable metal through reflow or by a Z-conductive anisotropic adhesive material.

It will be appreciated that the contact area between the solder bumps and the copper via posts is limited to the cross-sectional area of the copper via posts. All the contacts are in a single plane. This leads to a certain susceptibility of disconnected contacts and electrical open failures.

U.S. Ser. No. 14/150,683 filed on 8 Jan. 2004 describes a different approach. Here a multilayer composite electronic structure comprising feature layers extending in an X-Y plane is again described, wherein each adjacent pair of feature layers is separated by an inner via layer that comprises via posts that couple adjacent feature layers in a Z direction perpendicular to the X-Y plane, the via posts being embedded in an inner layer dielectric. In the structures disclosed, the multilayer composite structure further comprises at least one outer layer of terminations comprising at least one micro bump wherein the at least one micro bump comprises a via pillar capped with a solderable material. The solderable material on the micro bump fuses with the solder bumps of the flip chip package to be attached to the chip. This provides additional solderable material and aids adhesion. This solution is somewhat more expensive than other termination technologies because of the additional processing and the different compositions of solderable materials that are required.

Another challenge for some die applications is providing solderable materials that have Ultra Low Alpha particle counts. This is expensive and difficult to achieve with electro-plated materials.

Embodiments of the present invention address these issues.

BRIEF SUMMARY

A first aspect is directed to providing a multilayer composite electronic structure comprising feature layers extending in an X-Y plane, each adjacent pair of feature layers being separated by an inner via layer, the via layer comprising via posts that couple adjacent feature layers in a Z direction perpendicular to the X-Y plane, the via posts being embedded in an inner layer dielectric, the multilayer composite structure further comprising at least one outer layer of terminations comprising a two dimensional array of copper posts that is only partially embedded in an outer layer of dielectric such that part of each copper post protrudes beyond surface of the outer layer of dielectric.

Optionally, the at least one copper via post protrudes between 5 and 50 microns beyond the surface of the outer layer of dielectric.

Typically, the at least one copper via post protrudes between 10 and 30 microns beyond the surface of the outer layer of dielectric.

Typically, the outer layer of dielectric extends at least 5 microns beyond an outer layer of pads.

Typically, the outer layer of dielectric extends less than 20 microns beyond an outer layer of pads.

Typically, the outer layer of dielectric extends at least 10 microns beyond underlying dielectric layer.

Typically, the sectional area of the via posts is in a range compatible with chip bumps of an IC chip.

Typically the diameter of the copper posts is in a range of 60 to 110 microns.

Optionally, the diameter of the copper posts is a minimum of 25 microns.

Typically the separation of adjacent copper via posts is a minimum of 15 microns.

Typically, the pitch of copper via posts in outer layer is 40 microns.

Optionally, the outer dielectric has a smoothness of less than 100 nm.

Preferably, the outer dielectric has a smoothness of less than 50 nm.

Optionally, the outer dielectric is selected from the group consisting of NX04H (Sekisui), HBI-800TR67680 (Taiyo) and GX-13 (Afinomoto).

A second aspect is directed to a method of terminating a side of a multilayer composite structure having an outer layer of via posts embedded in a dielectric, comprising the steps of:
(i) obtaining a substrate;
(ii) thinning away the outer layer to expose the copper vias;
(iii) sputtering a layer of copper over the thinned surface;
(iv) applying, exposing and developing a penultimate pattern of photoresist;
(v) electroplating an external feature layer into the pattern;
(vi) stripping away the penultimate pattern of photoresist;
(vii) applying, exposing and developing an ultimate pattern of photoresist corresponding to the desired pattern of copper posts;
(viii) pattern plating copper posts into the ultimate pattern of photoresist;
(ix) stripping away the ultimate pattern of photoresist;
(x) etching away the seed layer;
(xi) laminating a dielectric outer layer;
(xii) planarizing the dielectric outer layer;
(xiv) plasma etching the dielectric outer layer to expose ends of via posts to a desired depth, and
(xv) applying an Organic Solder Preservative (OSP) to the copper posts.

Optionally, the dielectric outer layer is selected from the group consisting of a film dielectric and a dry film solder mask.

In one embodiment, step (xiv) of plasma etching comprises exposing to ion bombardment in a low pressure atmosphere comprising ionizing at least one of the gases selected from the group consisting of oxygen, tetra fluoride carbon and fluorine.

Optionally, the method further comprises step (xiii) of applying terminations on other side of the substrate.

In one embodiment, applying terminations comprises:
(a) thinning the other side to expose the ends of copper vias;
(b) sputtering a copper seed layer;
(c) applying, exposing and developing a layer of photoresist;
(d) electroplating copper pads into the photoresist;
(e) stripping away the photoresist;
(f) removing the seed layer, and
(g) depositing solder mask over substrate between and overlapping the copper pads.

BRIEF DESCRIPTION OF THE DRAWINGS

For a better understanding of the invention and to show how it may be carried into effect, reference will now be made, purely by way of example, to the accompanying drawings.

With specific reference now to the drawings in detail, it is stressed that the particulars shown are by way of example and for purposes of illustrative discussion of the preferred embodiments of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention; the description taken with the drawings making apparent to those skilled in the art how the several forms of the invention may be embodied in practice. In the accompanying drawings:

FIG. 1(ii) is a schematic illustration of the multilayer composite electronic structure of FIG. 1(i) having a first side thinned to expose the ends of embedded pillars;

FIG. 1(iii) is a schematic illustration of the multilayer composite electronic structure of FIG. 1(ii) with a copper seed layer sputtered onto the thinned surface;

FIG. 1(iv) is a schematic illustration of the multilayer composite electronic structure of FIG. 1(ii) after application, exposure and developing of a photoresist to provide a pattern of pads;

FIG. 1(vi) is a schematic illustration of the multilayer composite electronic structure with upstanding copper pads after stripping away the photoresist;

FIG. 1(vii) is a schematic illustration of the multilayer composite electronic structure after application, exposure and developing of a photoresist to provide a pattern of termination pegs;

FIG. 1(viii) is a schematic illustration of the multilayer composite electronic structure after plating copper into the patterned photoresist;

FIG. 1(ix) is a schematic illustration of the multilayer composite electronic structure with an array of upstanding copper and solder bumps after stripping away the photoresist;

FIG. 1(xi) is a schematic illustration of the multilayer composite electronic structure with a film dielectric or dry film solder mask laminated over the copper posts;

FIG. 1(xii) is a schematic illustration of the multilayer composite electronic structure after an optional stage of planarizing the film dielectric or dry film solder mask laminated over the array of copper posts, typically using chemical mechanical polishing (CMP);

FIG. 1(xiii)a shows the other side of the multilayer composite electronic structure ground down to expose the ends of the copper vias;

FIG. 1(xiii)b shows the other side of the multilayer composite electronic structure with a copper seed layer sputtered thereon;

FIG. 1(xiii)c shows the other side of the multilayer composite electronic structure with a pattern of photoresist after application, exposure and development;

FIG. 1(xiii)d shows the other side of the multilayer composite electronic structure with a copper layer electroplated into the pattern of photoresist;

FIG. 1(xiii)e shows the other side of the multilayer composite electronic structure after stripping away the photoresist;

FIG. 1(xiii)f shows the other side of the multilayer composite electronic structure after etching away the seed layer;

FIG. 1(xiii)g shows the other side of the multilayer composite electronic structure after depositing a patterned solder mask;

FIG. 1(xiv) shows the first side after plasma etching the dielectric film to expose the ends of the copper via posts to a desired depth, and FIG. 1(xv) shows the first side after applying an organic solder preserve to protect the copper via posts.

Like reference numbers and designations in the various drawings indicated like elements.

DETAILED DESCRIPTION

In the description hereinbelow, support structures consisting of metal vias in a dielectric matrix, particularly, copper via posts in a polymer matrix, such as polyimide, epoxy or BT (Bismaleimide/Triazine) or their blends, reinforced with glass fibers are considered.

It is a feature of Access' photo-resist and pattern or panel plating and laminating technology, as described in U.S. Pat. Nos. 7,682,972, 7,669,320 and 7,635,641 to Hurwitz et al., incorporated herein by reference, that large panels comprising very large arrays of substrates with very many via posts may be fabricated. Such panels are substantially flat and substantially smooth.

It is a further feature of Access' technology that vias fabricated by electroplating using photoresists, may be narrower than vias created by drill & fill. At present, the narrowest drill & fill vias are about 60 microns. By electroplating using photoresists, a resolution of under 50 microns, or even as little as 30 microns is achievable. Coupling ICs to such substrates is challenging. One approach for flip chip coupling is to provide copper pads that are flush with the surface of the dielectric. Such an approach is described in U.S. Ser. No. 13/912,652 to the present inventors.

Another approach is to provide solder on pads (SoP) terminations, where solder bumps are applied to the support structure to terminate copper vias. A version of this approach was described in U.S. Ser. No. 14/150,683 to the present inventors.

The first approach may become challenging for ultra thin dies with uneven bump count distribution, since there is a risk of die tilting phenomena during the die to substrate assembly, while the second approach might become more expensive because of the necessity to electroplate solderable materials having various metal compositions, and in some applications electroplating solderable materials that require Ultra Low Alpha particle counts.

Embodiments of the present invention address these issues by providing copper posts that protrude from the surface of the support structure. These protruding copper posts enable solderable material of the solder bumps on flip chip ICs to overlay and adhere to the perimeter of the copper post and not only to the end thereof, providing a "3 point contact" and thereby helping minimize die tilting during the assembly process, particularly with die designs having uneven bump count distribution, i.e. areas with isolated bumps and areas with a high density of bumps. Additionally, the copper posts raise the flip chip from the surface of the dielectric of the substrate and provide a cavity for under filling, and the upstanding copper posts facilitate the under fill flowing and filling the gap between the die and substrate. Thus the electromechanical bond of the solderable material is stronger, and the under fill that provides additional mechanical robustness to the IC-substrate interconnection is more effective.

Figure 1:
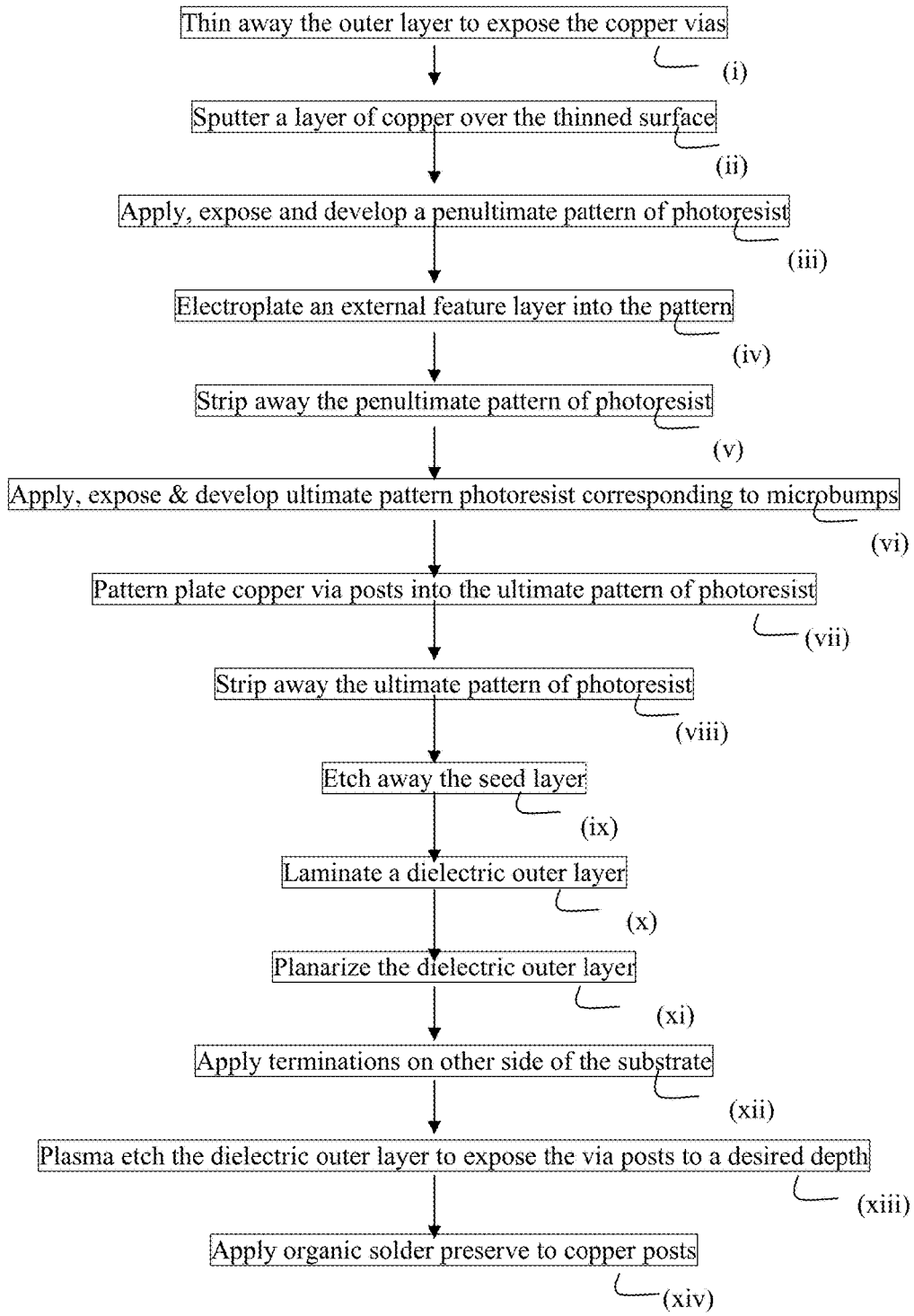
FIG. 1 is a flowchart illustrating the steps of a process for manufacturing protruding copper via post terminations on a multilayer composite electronic structure for more securely connecting an IC thereto, using flip chip technology.

With reference to FIG. 1 and to FIGS. 1(i) to 1(xv), a process for manufacturing very fine pitch copper via post terminations on a multilayer composite electronic structure for subsequently connecting an IC thereto, using flipchip technology is described.

Figure 1I:
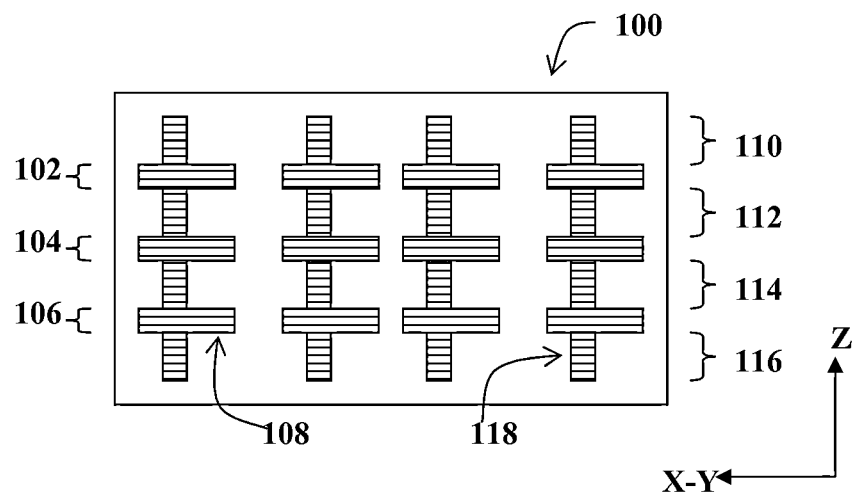
FIG. 1(i) is a schematic illustration of a multilayer composite electronic structure.
Figure 1:
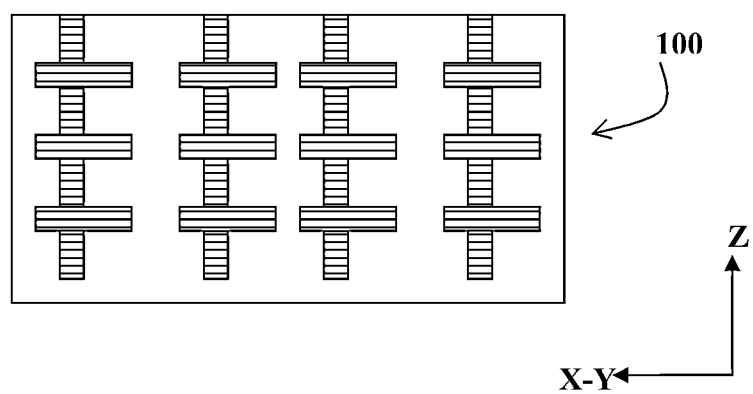
Figure 1:
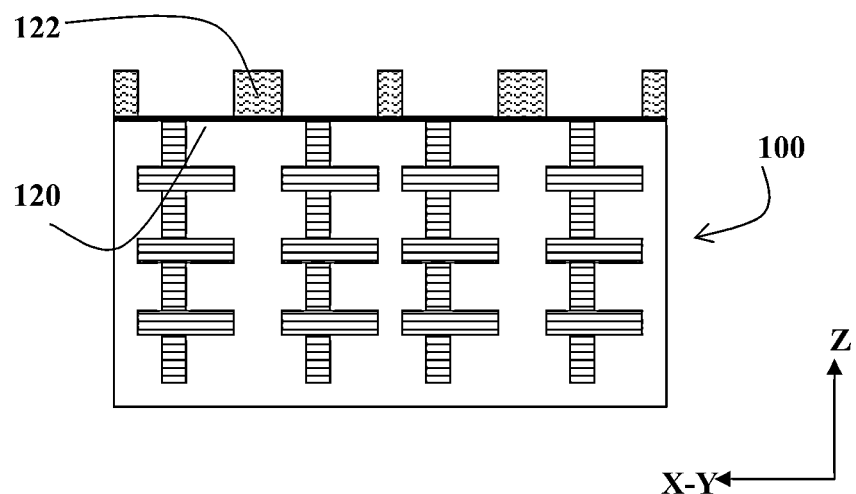

Firstly, a multilayer composite support structure of the prior art is obtained—step 1(i), as shown in FIG. 1(i). The multilayer support structures 100 includes functional layers 102, 104, 106 of components or features 108 separated by layers of dielectric 110, 112, 114, 116, which insulate the individual layers. Vias 118 through the dielectric layer provide electrical connection between features 108 in the adjacent functional or feature layers 102, 104, 106. Thus the feature layers 102, 104, 106 include features 108 generally laid out within the layer, in the X-Y plane, and vias 118 that conduct current across the dielectric layers 110, 112, 114, 116. Vias 118 are generally designed to have minimal inductance and are sufficiently separated to have minimum capacitances therebetween.

The vias could be fabricated by drill & fill, but to provide greater flexibility in fabrication, higher precision and more efficient processing by enabling large numbers of vias to be fabricated simultaneously, preferably the vias are fabricated by electroplating using the technology described in U.S. Pat. Nos. 7,682,972, 7,669,320 and 7,635,641 to Hurwitz et al. The via post technology allows different diameter vias, non circular vias, faraday cages, embedded passive components and other features. It will be appreciated that FIG. 1(i) is a schematic illustration for purposes of explanation. Real substrates may have more or less feature layers and more or less vias. Typically, substrates 100 comprise very large numbers of vias. The relative dimensions of vias, feature layers and dielectric, and, in subsequent schematics, of additional elements, are illustrative only, and are not to scale.

The side of the multilayer composite electronic structure 100 to which a chip is to be coupled by flip chip bonding is first thinned—step (ii) to expose the ends of the copper vias 110, see FIG. 1(ii). Chemical, mechanical, or preferably, Chemical Mechanical Polishing CMP may be used. Next, a seed layer of copper 120 is sputtered over the thinned surface—step (iii). The resulting structure is schematic illustrated in FIG. 1(iii).

Figure 1V:
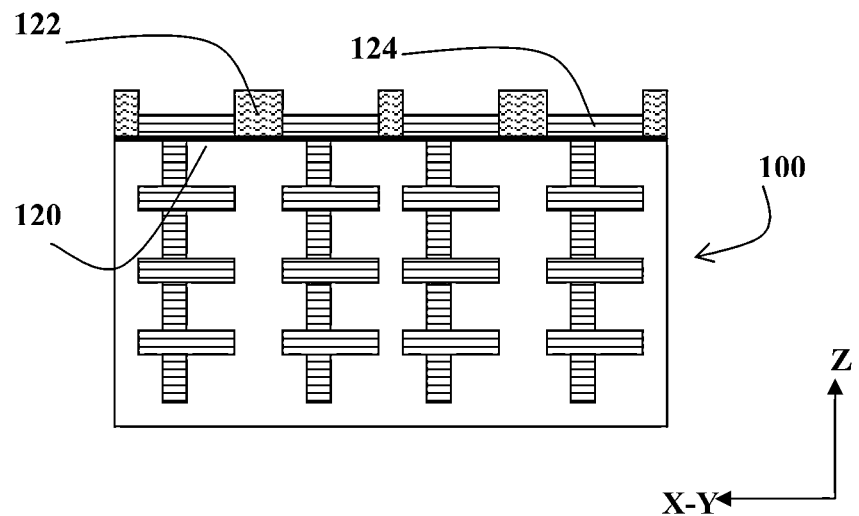
FIG. 1(v) is a schematic illustration of the multilayer composite electronic structure of FIG. 1(iv) after plating copper into the photoresist.
Figure 1:
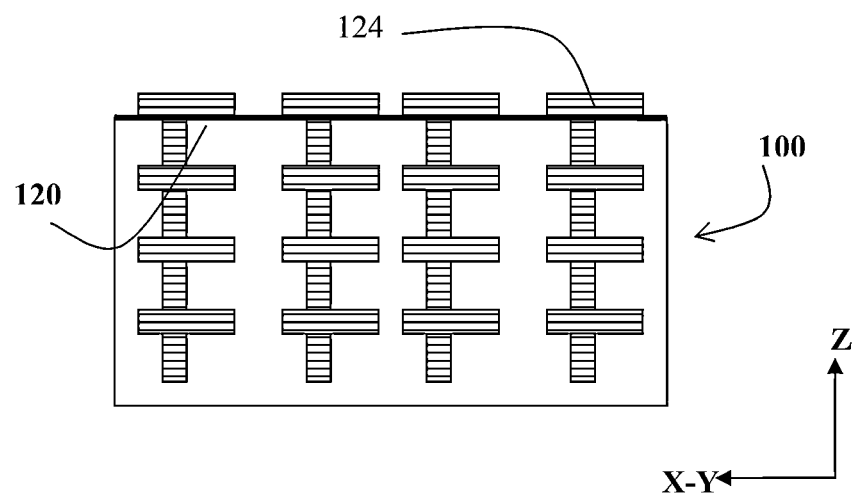
Figure 1:
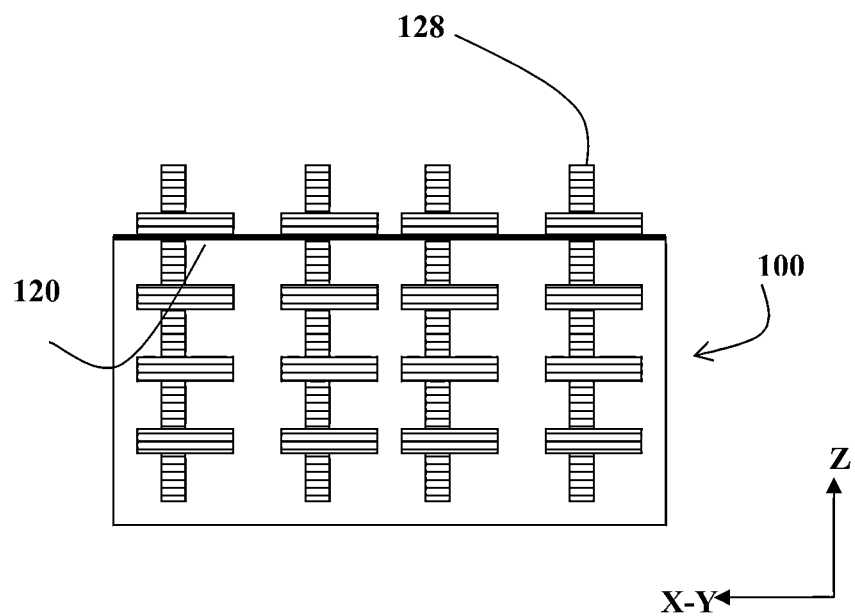

With reference to FIG. 1(iv), a layer of photoresist 122 is applied, exposed and developed to provide a pattern of pads—step (iv). As shown in FIG. 1(v), copper pads 124 are then plated into the photoresist—step (v), the copper seed layer 120 serving as an anode.

Now, the photoresist 122 FIG. 1(vi) is stripped away—step (vi), exposing the upstanding copper pads 124 and the seed layer 120 therebetween.

With reference to FIG. 1(vii) a second layer of photoresist 126 is applied, exposed and developed to provide a pattern of termination pegs—step (vii).

Copper posts 128 are now plated into the patterned photoresist 126—Step (viii) to provide the structure schematically shown in FIG. 1(viii).

The photoresist 126 is now stripped away—step ix, providing the structure illustrated in FIG. 1(ix) which shows the multilayer composite electronic structure with an array of upstanding copper posts.

Figure 1X:
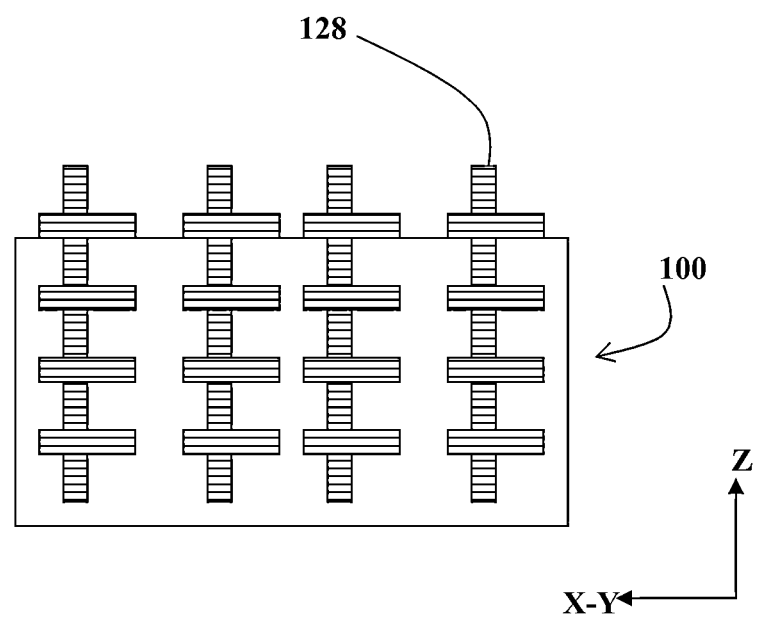
FIG. 1(x) is a schematic illustration of the multilayer composite electronic structure with an array of upstanding copper and solder bumps after etching away the copper seed layer.
Figure 1:
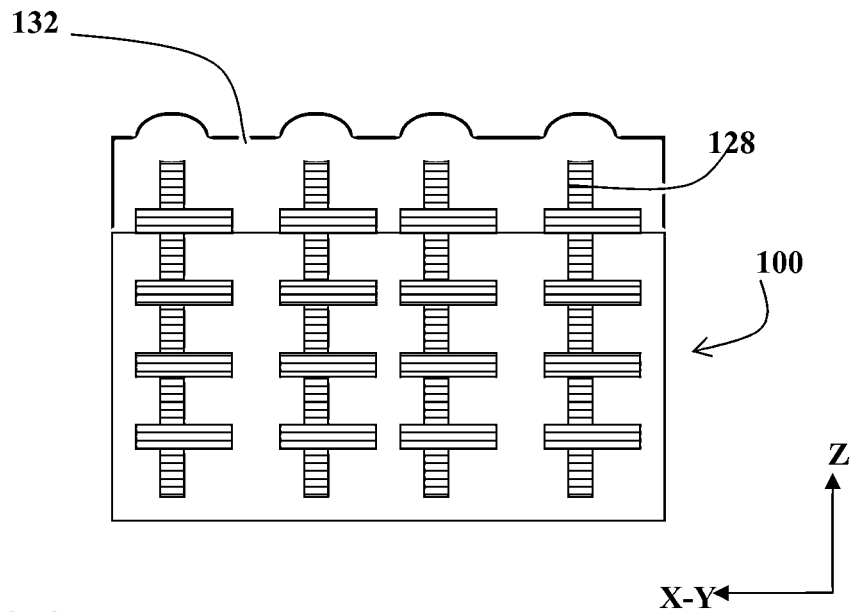
Figure 1:
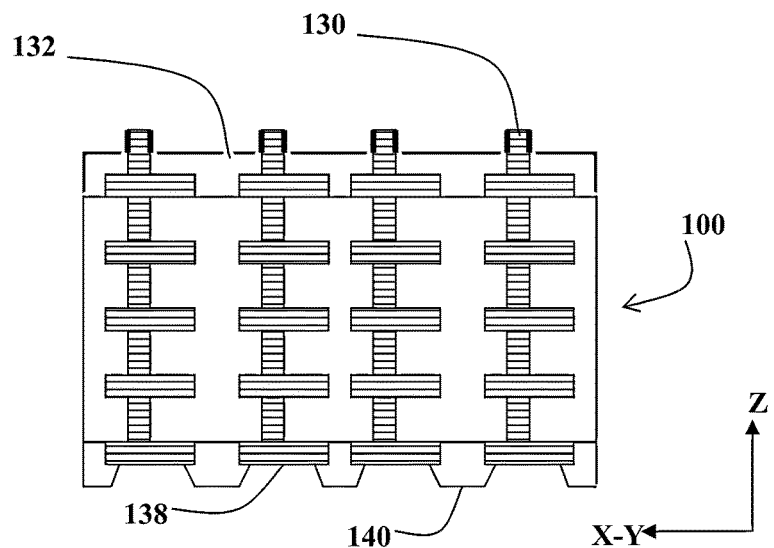

The copper seed layer 120 is now etched away—step (x). Providing the structure shown in FIG. 1(x).

A film dielectric or dry film solder mask 132 is laminated—step (xii) over the array of copper posts 128. A schematic illustration of the multilayer composite electronic structure 100 with the film dielectric or dry film solder mask 132 laminated over the array of copper posts 128 is shown in FIG. 1(xi).

Often, the surface of the film dielectric/dry film solder mask 132 is rather bumpy, and optionally, the film dielectric/dry film solder mask 132 is planarized—step (xii), see FIG. 1(xii), typically using chemical mechanical polishing (CMP).

At this stage, it is convenient to terminate the other side of the substrate 100 with a ball grid array. The process for so doing is shown in FIG. 2, and the various structures are illustrated in FIG. 1(xiii)a to FIG. 1(xiii)g.

Figure 2:
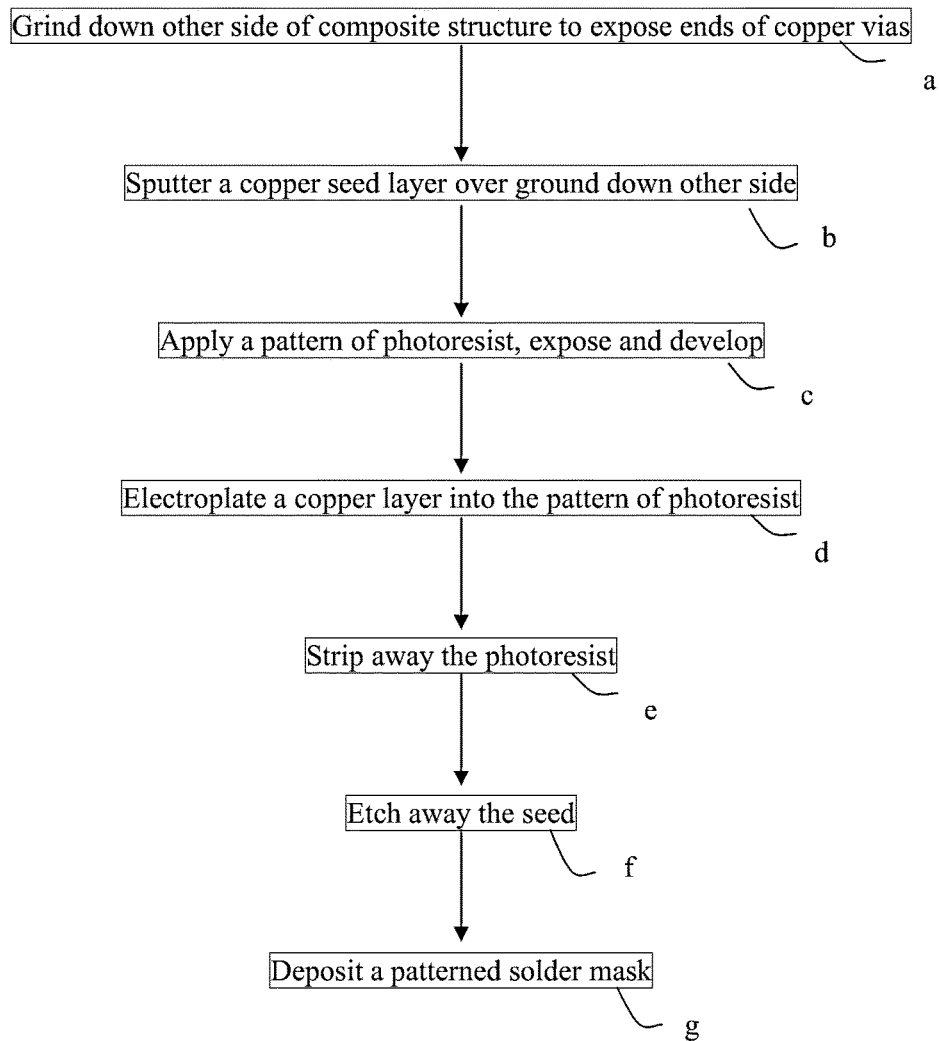
FIG. 2 is a flowchart illustrating the process for terminating the other side of the substrate with a ball grid array.

Thus, with reference to FIGS. 1(xiii)a to FIG. 1(xiii)g and to FIG. 2, to terminate the other side of the multilayer composite electronic structure 100, the other side is ground down—step a, to expose the ends of the copper vias 116, as schematically shown in FIG. 1(xiii)a. Copper is then sputtered—step b—over the ground surface to form a copper seed layer 134 as schematically shown in FIG. 1(xiii)b. Referring to FIG. 1(xiii)c photoresist 136 is now applied, exposed and developed—step c. As shown in FIG. 1(xiii)d, a copper layer 138 is now electroplated—step d—into the pattern of photoresist 136. The photoresist 136 is now stripped away—step e, providing the structure as illustrated in FIG. 1(xiii)e. The seed layer 134 is now etched away—step f, providing the structure illustrated in FIG. 1(xiii)f, and then a patterned solder mask 140 is applied—step g—around and overlapping the copper pads 138, forming the structure shown in FIG. 1(xii)g.

Solder balls may then be applied onto the copper pads 138 to create a ball grid array (BGA) interconnect of the finished package (after die assembly).

Figure 3:
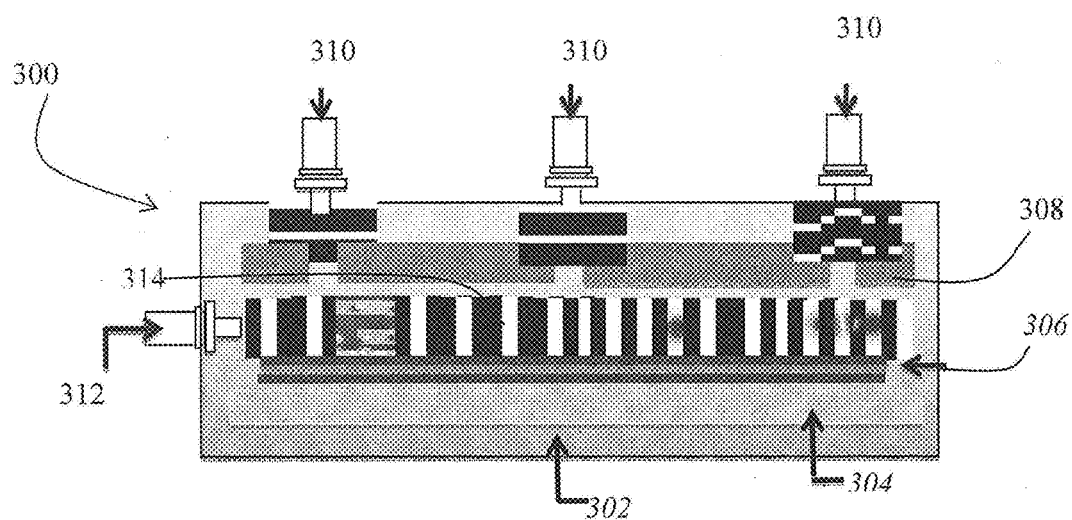
FIG. 3 is a schematic illustration of an in-line plasma etching station.

With reference to FIG. 3, an in-line plasma etching station 300 is schematically shown. This consists of a vacuum chamber 302 within which a carrier 304 supports a substrate 306. Gases to be ionized for the plasma etching process, such as Oxygen, Tetrafluoro-carbon ($CF_4$) and Argon, for example, may be introduced through inlet 312 into the vacuum chamber 302. By maintaining a potential difference between the substrate 306 and an upper electrode 308, a plasma zone 314 is created. Optical emission spectrometer analyzers 310 may be used to detect the end point where ends of copper posts are exposed, allowing accurate computer control.

By an ion assisted plasma etching process using the equipment 300 schematically shown in FIG. 3, the dielectric film 132 may be removed to leave exposed the ends 130 of the copper posts to a desired depth—step (xiv), see FIG. 1(xiv).

The plasma etching system of FIG. 3 provides highly reproducible erosion of the polymer dielectric, so that the heights of the copper posts 128 extending beyond the dielectric may be controlled. The height of the copper posts 128 may be anywhere in the range of, say, between 5 μm and 50 μm and is preferably within the range of between about 10 μm and 30 μm. A Spectroscopic reflect-meter may be used to measure the dielectric thickness. Consequently, this level of precision is easy to achieve with high reproducibility.

The thickness range of the remaining dielectric that is not plasma eroded is usually in the range of 5 μm to 20 μm over the conductor pads which are typically in the range of around 7 μm to 20 μm thick, so the dielectric of the outer layer usually extends somewhere around 12 μm to 40 μm beyond the previously deposited dielectric.

The upstanding ends of the copper via posts 128 may be protected with a commercially available organic varnish 150 such as organic solder preserve (OSP) (step (xv), FIG. 1(xv), that can be easily dissolved for attaching a flip chip to the upstanding copper posts 128.

Because the ends of the copper posts 128 are upstanding, the solder from the flip-chip bumps of an IC can attach around the perimeter of the copper posts 128, (the circumference where copper posts 128 are cylindrical) and not just to the flat ends of the posts, a stronger "3 point contact" coupling is formed. Furthermore, since the flip chips are raised away from the plasma thinned dielectric 132 by the copper posts 128, there is a void into which under fill can flow to wet and fill, providing better adhesion to both underside of the flip chip and to the dielectric 132. In this regard, the copper posts 128 help anchor the under fill. Furthermore, the better penetration of the under-fill and the ductile copper posts help prevent the IC chips popping off due to the mismatch in coefficient of thermal expansion between the Silicon of the IC and the polymer dielectric of the substrate.

Figure 4A:
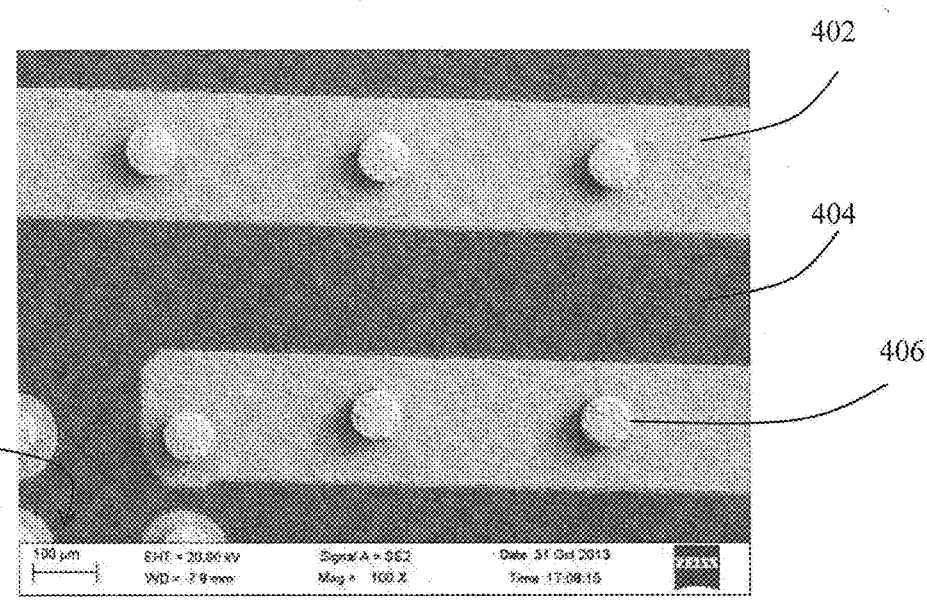
FIG. 4a is a scanning electron micro photograph (SEM micrograph) showing copper pads separated with dielectric on the surface of a substrate and showing upstanding copper via posts thereupon from above, i.e. from an angle of 0°.

With reference to FIG. 4a, there is shown a scanning electron microphotograph (SEM micrograph) showing copper pads 402 separated with dielectric 404 on the surface of a substrate and showing upstanding copper via posts 406 thereupon from above, i.e. from an angle of 0°. The scale bar is 100 microns, and shows that the via posts are approx. 50 microns in diameter.

Figure 4B:
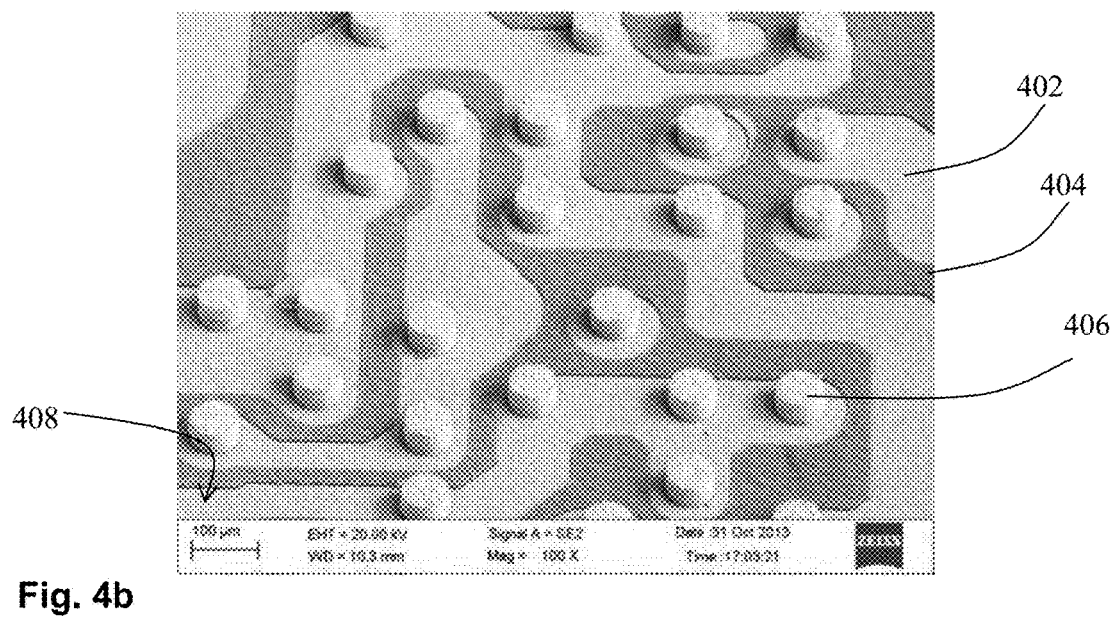
FIG. 4b is a scanning electron micrograph showing copper pads separated with dielectric on the surface of the substrate and having upstanding copper via posts thereupon from above and from an angle of 45°, at a magnifications such that the scale bar is 100 microns.

Referring to FIG. 4b there is shown a scanning electron micrograph showing copper pads 402 separated with dielectric 404 on the surface of the substrate and having upstanding copper via posts 406 thereupon from above and from an angle of 45°, at a magnifications such that the scale bar 408 is 100 microns.

Ideally the copper vias 128 have similar diameters to the solder bumps on the chips to be attached thereto. There are typically 60 μm to 110 μm. The technology described hereinabove allows copper posts with diameters of as little as 35 μm. These may be separated by a spacing of about 20 μm, providing a pitch of 55 μm. Indeed, micro posts of 15 micron diameter separated by 15 micron spaces are also possible.

There are a number of polymer dielectric films that are commercially available that have been found appropriate for laminating the very high pitch substrate arrays of the outer layers. These include NX04H available from Sekisui, HBI-800TR67680 available from Taiyo and GX-13 available from Ajinomoto.

The above description is provided by way of explanation only. It will be appreciated that the present invention is capable of many variations.

Several embodiments of the present invention have been described. Nevertheless, it will be understood that various modifications may be made without departing from the spirit and scope of the invention. Accordingly, other embodiments are within the scope of the following claims.

Thus persons skilled in the art will appreciate that the present invention is not limited to what has been particularly shown and described hereinabove. Rather the scope of the present invention is defined by the appended claims and includes both combinations and sub combinations of the various features described hereinabove as well as variations and modifications thereof, which would occur to persons skilled in the art upon reading the foregoing description.

In the claims, the word "comprise", and variations thereof such as "comprises", "comprising" and the like indicate that the components listed are included, but not generally to the exclusion of other components.

What is claimed is:

1. A method of fabricating a multilayer composite structure comprising feature layers extending in an X-Y plane, each adjacent pair of feature layers being separated by an inner via layer comprising via posts that couple adjacent feature layers in a Z direction perpendicular to the X-Y plane, the via posts being embedded in an inner layer dielectric, the multilayer composite structure further comprising at least one outer layer of terminations comprising a two dimensional array of copper via posts that are only partially embedded in an outer layer of dielectric that extends for at least five microns beyond an outer layer of pads, such that part of each copper via post in said two-dimensional array protrudes between 5 and 50 microns beyond a surface of the outer layer of dielectric, comprising the steps of:

(i) obtaining a substrate comprising alternating copper feature layers and connection via layers embedded in a dielectric;
(ii) thinning away an outer layer to expose ends of a layer of copper vias;
(iii) sputtering a layer of copper over the thinned surface;
(iv) applying, exposing and developing a penultimate pattern of photoresist;
(v) electroplating an external feature layer into the pattern;
(vi) stripping away the penultimate pattern of photoresist;
(vii) applying, exposing and developing an ultimate pattern of photoresist corresponding to the desired a two dimensional array of copper via posts;
(viii) pattern plating copper via posts into the ultimate pattern of photoresist;
(ix) stripping away the ultimate pattern of photoresist;
(x) etching away the seed layer;
(xi) laminating a dielectric outer layer;
(xii) planarizing the dielectric outer layer;
(xiv) plasma etching the dielectric outer layer to expose ends of said two dimensional array of copper via posts to a desired depth of between 5 microns and 50 microns, and
(xv) applying an Organic Solder Preservative (OSP) to the copper posts.

2. A multilayer composite electronic structure comprising feature layers extending in an X-Y plane, each adjacent pair of feature layers being separated by an inner via layer, the via layer comprising via posts that couple adjacent feature layers in a Z direction perpendicular to the X-Y plane, the via posts being embedded in an inner layer dielectric, the multilayer composite structure further comprising at least one outer layer of terminations comprising a two dimensional array of copper via posts that are only partially embedded in an outer layer of dielectric that extends for at least five microns beyond an outer layer of pads, such that part of each copper via post in said two-dimensional array protrudes beyond a surface of the outer layer of dielectric wherein the array of copper posts protrude between 5 and 50 microns beyond the surface of the outer layer of dielectric.

3. The multilayer composite electronic structure of claim 2, wherein the array of copper posts protrude between 10 and 30 microns beyond the surface of the outer layer of dielectric.

4. The method of claim 1 wherein the dielectric outer layer is selected from the group consisting of a film dielectric and a dry film solder mask.

5. The multilayer composite electronic structure of claim 2, wherein the outer layer of dielectric extends less than 20 microns beyond the outer layer of pads.

6. The multilayer composite electronic structure of claim 2, wherein the outer layer of dielectric extends at least 10 microns beyond underlying dielectric layer.

7. The multilayer composite electronic structure of claim 2, wherein cross sections of the copper posts are in a range compatible with chip bumps of an IC chip.

8. The multilayer composite electronic structure of claim 2, wherein the diameter of the copper posts is in a range of 60 to 110 microns.

9. The multilayer composite electronic structure of claim 2, wherein the diameter of the copper posts is a minimum of 25 micron.

10. The multilayer composite electronic structure of claim 2, wherein the separation of adjacent copper via posts is a minimum of 15 micron.

11. The multilayer composite electronic structure of claim 2, wherein the pitch of the copper posts in outer layer is 40 microns.

12. A multilayer composite electronic structure comprising feature layers extending in an X-Y plane, each adjacent pair of feature layers being separated by an inner via layer, the via layer comprising via posts that couple adjacent feature layers in a Z direction perpendicular to the X-Y plane, the via posts being embedded in an inner layer dielectric, the multilayer composite structure further comprising at least one outer layer of terminations comprising in an outer layer of dielectric that has a smoothness of less than 100 nm, such that part of each copper via post in said two-dimensional array protrudes beyond a surface of the outer layer of dielectric wherein the array of copper posts protrude between 5 and 50 microns beyond the surface of the outer layer of dielectric.

13. The multilayer composite electronic structure of claim 12, wherein the outer layer of dielectric has a smoothness of less than 50 nm.

14. The multilayer composite electronic structure of claim 12, wherein the outer layer of dielectric is a polymer dielectric film.

15. The method of claim 1 where step (xiv) of plasma etching comprises exposing to ion bombardment in a low pressure atmosphere comprising ionizing at least one of the gases selected from the group consisting of oxygen, tetrafluoride carbon and fluorine.

16. The method of claim 1 further comprising step (xiii) of applying terminations on other side of the substrate.

17. The method of claim 16, wherein applying terminations comprises:
(a) thinning the other side to expose the ends of copper vias;
(b) sputtering a copper seed layer;
(c) applying, exposing and developing a layer of photoresist;
(d) electroplating copper pads into the photoresist;
(e) stripping away the photoresist;
(f) removing the seed layer, and
(g) depositing solder mask over substrate between and overlapping the copper pads.

* * * * *